United States Patent [19]
Machida et al.

[11] 4,088,963
[45] May 9, 1978

[54] GAIN CONTROL CIRCUIT

[75] Inventors: Fujio Machida, Nakaminato; Kazuya Takahashi, Mito, both of Japan

[73] Assignee: Hitachi, Ltd., Japan

[21] Appl. No.: 694,725

[22] Filed: Jun. 10, 1976

[30] Foreign Application Priority Data
Jun. 13, 1975 Japan .................................. 50-70813

[51] Int. Cl.² .............................................. H03G 3/30
[52] U.S. Cl. ...................................... 330/284; 330/85; 330/86; 330/252; 330/279
[58] Field of Search .................... 330/85, 86, 252, 279, 330/284

[56] References Cited
U.S. PATENT DOCUMENTS

| | | | |
|---|---|---|---|
| 3,582,681 | 6/1971 | Norman et al. | 330/29 X |
| 3,721,914 | 3/1973 | Nakamura | 330/30 D X |

Primary Examiner—Lawrence J. Dahl
Attorney, Agent, or Firm—Craig & Antonelli

[57] ABSTRACT

A gain control circuit includes an audio signal attenuator circuit and a circuit for controlling the current in the audio signal attenuator circuit. The audio signal attenuator circuit is inserted between an input terminal of an amplifier circuit for amplifying an audio signal and an output terminal of a diode for detecting and rectifying part of the audio signal appearing at the output terminal of the amplifier circuit. The signal attenuator circuit and the current control circuit comprise a plurality of transistors and operate when, in response to application of an audio signal to the amplifier circuit, a DC voltage of certain level is produced at the output terminal of the rectifying diode. Part of the audio signal applied to the amplifier circuit is bypassed and attenuated, while at the same time stabilizing the DC bias in the amplifier circuit.

18 Claims, 15 Drawing Figures

GAIN CONTROL CIRCUIT

BACKGROUND OF THE INVENTION

1. Field of the Invention

This invention relates to a gain control circuit for the automatic record level adjustment in the sound recording circuit of a tape recorder or the like, or more in particular to a gain control circuit whose elements are adapted to be arranged in integrated circuits.

2. Description of the Prior Art

Figure 1:
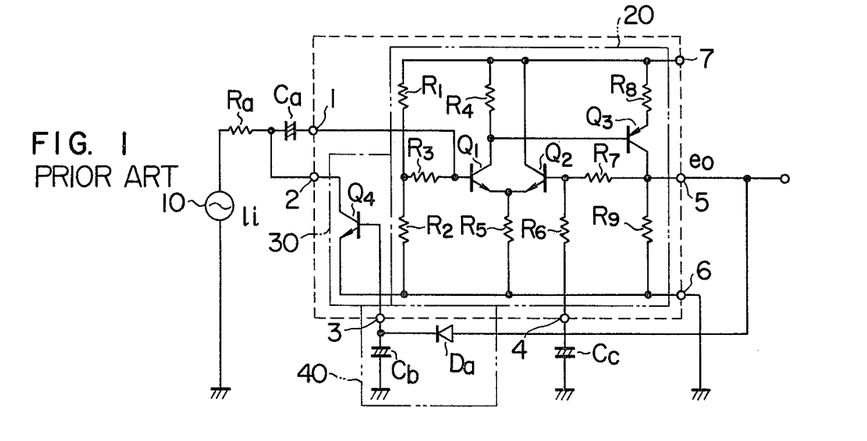
FIG. 1 is a circuit diagram showing a conventional gain control circuit.

One of the conventional gain control circuits used for tape recorders or like devices is shown in FIG. 1. In this drawing, reference numeral 10 shows an input signal source for, say, an audio signal $ei$. Numeral 20 shows an amplifier circuit, which in this case is a differential amplifier circuit, for amplifying and introducing to the output terminal 5 the audio signal $ei$ applied through the resistor $Ra$ and the capacitor $Ca$ to the input terminal (pin) 1. Reference characters $Q_1$ and $Q_2$ show an NPN differential transistor pair with the emitters thereof connected to each other on the one hand and to the ground terminal 6 through the resistor $R_5$ on the other. The base of the transistor $Q_1$ is connected to the input terminal 1 and also, through the resistors $R_3$ and $R_1$, to the DC power supply terminal 7 supplied with a DC voltage. The base of the transistor $Q_1$ is further connected to the ground terminal 6 through the resistors $R_3$ and $R_2$. The collector of the transistor $Q_1$ is connected through the resistor $R_4$ to the power supply terminal 7 on the one hand and to the base of the PNP transistor $Q_3$ on the other. The collector of the transistor $Q_2$ is connected directly to the power supply terminal 7, while its base is connected via the resistor $R_6$ to the terminal 4 on the one hand and to the collector of the transistor $Q_3$ through the resistor $R_7$ on the other. The collector of the transistor $Q_3$ is connected to the earth terminal 6 via the resistor $R_9$ and also to the output terminal 5. The emitter of the transistor $Q_3$ is connected via the resistor $R_8$ to the power terminal 7. Terminal 1 is grounded through the capacitor $Ca$, the resistor $Ra$ and the signal source 10. Terminal 4 is grounded through the capacitor $Cc$, while the terminal 6 is grounded directly. Terminal 5 is connected to the input terminal of an amplifier circuit in the next stage (not shown). Numeral 30 shows an audio signal attenuator circuit including a controlled transistor $Q_4$ for bypassing part of the audio signal $ei$ to the ground terminal, and numeral 40 a rectifier circuit for detecting and rectifying part of the audio signal produced at the output terminal 5 of the amplifier circuit 20. The resulting rectified signal is used to control the controlled transistor $Q_4$ of the audio signal attenuator circuit 30.

In the circuit configuration of FIG. 1, the part defined by a dotted line shows an integrated circuit. Assume that the audio signal $ei$ is applied to the input terminal of the amplifier circuit 20 via the resistor $Ra$ and the capacitor $Ca$. An amplified audio signal is produced at the output terminal 5 of the amplifier circuit 20. Part of the audio signal is rectified by the rectifier circuit 40, and the rectified DC signal is applied to the base of the controlled transistor $Q_4$ of the audio signal attenuator circuit 30. As a result, the transistor $Q_4$ is forward biased and controlled in such a manner that the collector-emitter impedance thereof decreases with the increase in the DC signal. Part of the audio signal $ei$ from the audio signal source 10 is thus attenuated by bypassing it via the transistor $Q_4$ thereby to control the gain of the whole circuit.

In this conventional gain control circuit in which the collector-emitter impedance of the controlled transistor $Q_4$ is controlled so that the input signal $ei$ is attenuated by bypassing a part of the input signal $ei$ to the ground terminal via the transistor $Q_4$ so as to control the gain of the whole circuit, the collector-emitter DC voltage $Vce$ of the transistor $Q_4$ is generally set at zero so as to provide a great change in the collector-emitter impedance of the transistor $Q_4$ when a DC signal is applied to the base of the controlled transistor $Q_4$. In other words, unless the DC voltage $Vce$ between the collector and emitter of the transistor $Q_4$ is set at zero, the collector-emitter impedance of the transistor $Q_4$ cannot be satisfactorily changed, thus making an effective gain control impossible. For this reason, the capacitor $Ca$ or the like is required to be inserted between the collector terminal 2 of the transistor $Q_4$ and the input terminal 1 of the sound amplifier circuit 20 for providing DC isolation. This configuration, which presents no significant problem in the case of the circuit being comprised of discrete circuit elements, is very disadvantageous in the application of a monolithic integrated circuit thereto, because of the need for one additional terminal pin, which might involve a problem in the design of integrated circuits having a limited number of terminals.

SUMMARY OF THE INVENTION

Accordingly, it is an object of the present invention to provide a gain control circuit with a small number of terminals suitable for application of monolithic integrated circuit, in which the output terminal of the gain control circuit may be connected to the input terminal of the sound amplifier circuit in DC mode, not through a capacitor.

Another object of the invention is to provide a gain control circuit in which, irrespective of the magnitude of the control signal, a DC current is prevented from, say, flowing out to another circuit and affecting the bias potential of the same circuit.

In order to achieve the above-mentioned objects, the gain control circuit according to the present invention is characterized in that part of the audio signal from the audio signal circuit is detected and rectified, that part of the audio signal applied to the input terminal of a sound amplifier circuit in the audio circuit is bypassed and attenuated by an audio signal attenuator circuit which is actuated when a DC voltage resulting from the detection and rectification of the part of the audio signal exceeds a predetermined level, and that the output part of the audio signal attenuator circuit is floating in DC mode. The output terminal of the audio signal attenuator circuit is connected to the input terminal of the sound amplifier circuit. The potential of the output part of the audio signal attenuator circuit is set by the bias potential of the amplifier circuit.

BRIEF DESCRIPTION OF THE DRAWINGS

FIGS. 12 and 13 are circuit diagrams showing additional embodiments of the present invention.

DESCRIPTION OF THE PREFERRED EMBODIMENTS

Figure 2:
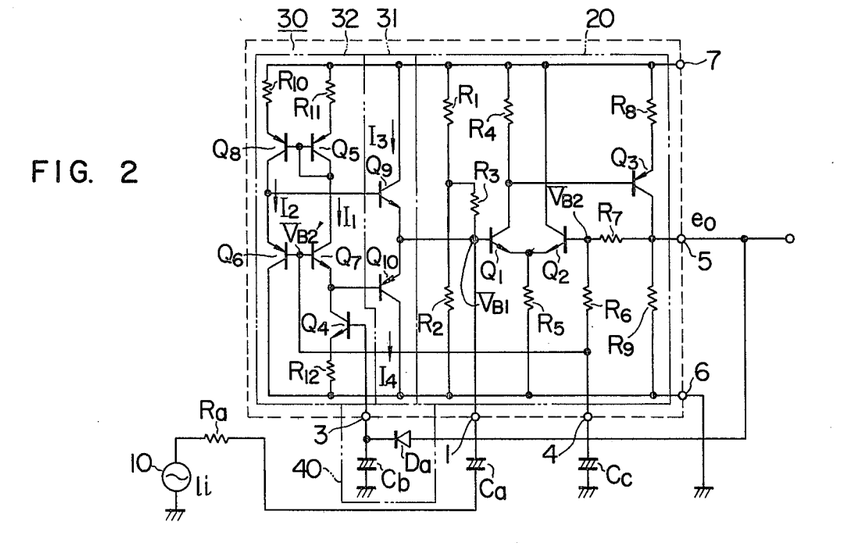
FIG. 2 is a circuit diagram showing an embodiment of the gain control circuit according to the present invention.

The present invention will be now described with reference to specific embodiments. A circuit diagram showing an embodiment of the invention is shown in FIG. 2. In the circuit configuration of FIG. 2, like component elements as in FIG. 1 are denoted by like reference numerals and will not be described again.

The circuit of FIG. 2 according to the invention is different from the conventional circuit in that in the circuit under consideration, an attenuator circuit 30 includes an audio signal attenuator circuit 31 having a plurality of transistors $Q_9$ and $Q_{10}$, and a current control circuit 32 for the audio signal attenuator circuit 31, having a plurality of transistors and resistors, the current control circuit 32 including transistors $Q_4$, $Q_5$, $Q_6$, $Q_7$ and $Q_8$.

The bases of the PNP transistors $Q_8$ and $Q_5$ are connected not only to each other but also to the collector of the transistor $Q_5$. The emitters of the transistors $Q_8$ and $Q_5$ are connected to the DC power terminal 7 via the resistors $R_{10}$ and $R_{11}$ respectively. The collector of the transistor $Q_8$ is connected to the emitter of the PNP transistor $Q_6$ on the one hand and to the base of the NPN transistor $Q_9$ of the signal attenuator circuit 31. The collector of the transistor $Q_5$ is connected to the collector of the NPN transistor $Q_7$. The bases of the transistors $Q_6$ and $Q_7$ are connected not only to each other but also, through the resistor $R_6$ of the differential amplifier circuit 20, to the reverse input terminal, that is, the base of the differential transistor $Q_2$. The collector of the transistor $Q_6$ is connected directly to the ground terminal 6, while the emitter of the transistor $Q_7$ is connected to the collector of the NPN transistor $Q_4$ and also to the base of the PNP transistor $Q_{10}$ of the signal attenuator circuit 31. The emitter of the transistor $Q_4$ is connected to the ground terminal 6 via the resistor $R_{12}$, while the base thereof is connected directly to the gain control voltage supply terminal 3. The emitters of the transistors $Q_9$ and $Q_{10}$ of the signal attenuator circuit 31 are connected not only to each other but also to the non-reverse input terminal of the differential amplifier circuit 20, i.e., to the base of the differential transistor $Q_1$. The collector of the transistor $Q_{10}$ is connected directly to the ground terminal 6. The differential amplifier circuit 20, the audio signal attenuator circuit 31 and the control circuit 32 for the circuit 31 are constructed of integrated circuits respectively. The anode of the rectifying diode Da of the rectifier circuit 40 is connected to the output terminal 5 of the differential amplifier circuit 20, while the cathode thereof is connected through the capacitor Cb to the ground on the one hand and to the gain control voltage supply terminal 3 on the other.

In the circuit configuration shown in FIG. 2, assume that current $I_2$ flows in the transistors $Q_8$ and $Q_6$ of the attenuator circuit 30, that current $I_1$ flows in the transistors $Q_5$ and $Q_7$, and that currents $I_3$ and $I_4$ flow in the transistors $Q_9$ and $Q_{10}$ respectively. The impedances $r_9$ and $r_{10}$ as viewed from the emiters of the transistors $Q_{10}$ is expressed as $$r_9 = \frac{26}{I_3} + \frac{26}{I_2 h_{fe9}} = r_{e9} + \frac{r_{e6}}{h_{fe9}} \doteq r_e \quad (1)$$

$$r_{10} = \frac{26}{I_4} + \frac{26}{I_1 h_{fe10}} = r_{e10} + \frac{r_{e10}}{h_{fe10}} \doteq r_e \quad (2)$$

Figures 3A, 3B:
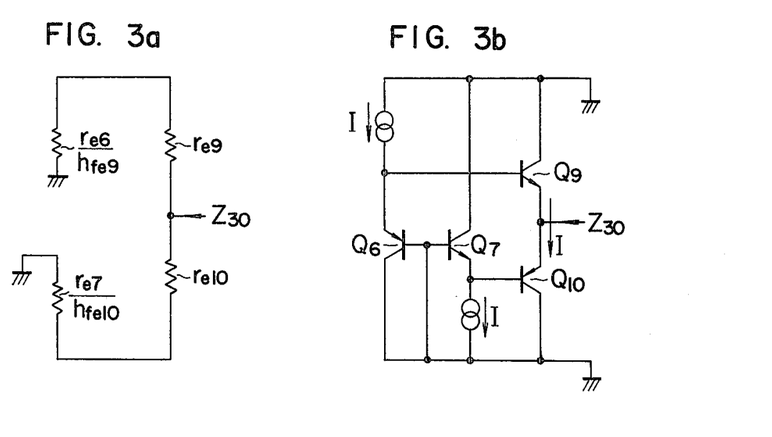
FIGS. 3a and 3b are diagrams showing equivalent circuits of the audio signal attenuator circuit and a control circuit therefor shown in FIG. 2.

$(\frac{26}{I_3} = r_{e9}, \frac{26}{I_2} = r_{e6}, \frac{26}{I_4} = r_{e10}$ and $\frac{26}{I_2} = r_{e7};$ $r_{e9} \doteq r_{e6} \doteq r_{e10} \doteq r_{e7} \doteq r_e; \ h_{fe} \gg 1)$ where $r_{e6}, r_{e7}, r_{e9}, r_{e10}$ = emitter diffusion resistances of transistors $Q_6$, $Q_7$, $Q_9$, $Q_{10}$ respectively $h_{fe9}, h_{fe10}$ = current amplification factor of emitter-grounded transistors $Q_9$ and $Q_{10}$ respectively 26 = emitter-base impedance of the transistor obtained from $q/kT$ $q$ = electric charges $k$ = Boltzman constant $T$ = temperature Also, the impedance $Z_{30}$ at the side of the attenuator circuit 30 as viewed from the input terminal 1 is, from the equivalent circuit of FIG. 3, expressed as $$Z_{30} = \frac{r_9 \cdot r_{10}}{r_9 + r_{10}} \quad (3)$$

Substituting the equations (1) and (2) into the equation (3), $$Z_{30} = \frac{r_e^2}{2r_e} = \frac{r_e}{2} \quad (4)$$

The impedance Z at the side of the amplifier circuit 20, the signal attenuator circuit 31 and the control circuit 32 of the attenuator circuit 30 as viewed from the input terminal 1 is given by $$Z = \frac{1}{Y} \quad (5)$$

where $Y = \frac{1}{R_3} + \frac{1}{R'} + \frac{1}{Z_{30}} \quad (6)$ ($R'$ = impedance of transistor $Q_1$)

Further, the input signal $ei$ is attenuated by the resistance $Ra$ and impedances of the amplifier circuit 20 and the signal attenuator circuit 31, so that the input signal $ei$ at the input terminal 1 is $$ei' = \frac{Z}{Ra + Z} ei \quad (7)$$

When substituting the equations (5) and (6) into the equation (7), $$ei' = \frac{ei}{YRa+1} = \frac{ei}{Ra(\frac{1}{R_3} + \frac{1}{R'} + \frac{1}{Z_{30}}) + 1} \quad (8)$$

The equation (8) represents the value of the input signal obtained as a result of attenuation of the input signal $ei$ by the impedance of the amplifier circuit 20 and the attenuator circuit 30. This value depends on the magnitude of the impedance Z.

In this circuit configuration, assume that the DC voltage at the gain control voltage supply terminal 3 in the absence of signal or presence of a small signal, i.e., the DC voltage obtained by rectifying a part of the audio output signal of the amplifier circuit 20 by the rectifying diode $Da$, is zero, or less than the base-emitter voltage of the transistor $Q_4$ in the attenuator circuit 30, i.e., the threshold voltage thereof, say, 0.6 or 0.7 V. In such a case, the transistors $Q_4$, $Q_5$, $Q_6$, $Q_7$, $Q_8$, $Q_9$ and $Q_{10}$ of the attenuator circuit 30 are set in non-conducting state.

When the transistors of the attenuator circuit are in non-conductive state, the impedance $Z_{30}$, as given by equation (3), of the signal attenuator circuit 31 and the control circuit 32 as measured at the input terminal 1 is as high as to be almost infinite. As a result, all of the input signal $ei$ of the input signal source 10 is introduced through the resistor $Ra$, capacitor $Ca$ and the input terminal 1 to the differential amplifier circuit 20 for amplification. In the process, the input signal $ei$ is not attenuated by the signal attenuator circuit 31, though it is somewhat attenuated by the resistor $Ra$ and the impedance of the amplifier circuit 20.

From the equation (8), the attenuation is $$ei' \doteq \frac{ei}{\frac{Ra}{R_3}+1} = \frac{R_3}{Ra+R_3} ei \quad (9)$$

$$Z_{30}, R' >> R_3)$$

This attenuation, however, is very small.

Next, assume a case where the input signal $ei$ is increased in level to such an extent that an increased rectifying voltage of the rectifying diode $Da$ causes the DC voltage at the gain control voltage supply terminal 3 to be increased, with the result that the DC voltage exceeds the base-emitter voltage of the transistor $Q_4$ of the attenuator circuit 30. The transistor $Q_4$ is biased in forward direction and begins to conduct. This is followed by the conduction of the other transistors $Q_5$, $Q_6$, $Q_7$, $Q_8$, $Q_9$ and $Q_{10}$. A DC current $I_1$ flows from the DC power terminal 7 to the earth terminal through the resistor $R_{11}$, transistors $Q_5$, $Q_7$ and $Q_4$ and resistor $R_{12}$, while a DC current $I_2$ flows through the resistor $R_{10}$, transistors $Q_8$ and $Q_6$. Further, a DC current $I_3$ flows in the transistor $Q_9$, and a DC current $I_4$ in the transistor $Q_{10}$. If resistor $R_{10} = R_{11}$, the DC current $I_1$ is equal to the DC current $I_2$. Also, assume that all the transistors in the circuit of FIG. 2 have the same characteristics and that the current amplification factors $h_{fe}$ thereof are so large as to permit the base current to be neglected. The emitter potential of the transistors $Q_9$ and $Q_{10}$ of the signal attenuator circuit 31, i.e., the base potential $V_{B1}$ of the transistor $Q_1$ of the differential amplifier circuit 20, the base potential $V_{B2}$ of the transistor $Q_2$, and the base potential $V_{B2}'$ of the transistors $Q_6$ and $Q_7$ of the control circuit 32 are equal to each other. Therefore, the base-emitter voltage $V_{be7}$ of the transistor $Q_7$ is equal to the base-emitter voltage $V_{be10}$ of the transistor $Q_{10}$. In like manner, the base-emitter voltage $V_{be6}$ of the transistor $Q_6$ is equal to the base-emitter voltage $V_{be9}$ of the transistor $Q_9$. As a result, the DC currents $I_1$, $I_2$, $I_3$ and $I_4$ have the relations $I_1 = I_4$ and $I_2 = I_3$. Since $I_1 = I_2$, the DC current $I_3$ is also equal to the current $I_4$. Under this condition, the DC current at the emitter terminal of the signal attenuator circuit 31 does not flow outside or into the amplifier circuit 20. Also no DC current flows thereto from the amplifier circuit 20. Therefore, even though the output terminal of the signal attenuator circuit 31 is connected directly in DC mode to the input terminal of the differential amplifier 20, the DC bias of the amplifier circuit 20 is not affected by the signal attenuator circuit 31. In other words, the DC bias of the amplifier circuit 20 is maintained stable as it is not affected by the signal attenuator circuit 31.

When the transistors in the circuit 30 conduct and current flows in them as described above, the output impedance $Z_{30}$ of the attenuator circuit 30 as viewed from the input terminal 1 is reduced.

Now, let us consider a case involving a small signal, for example, a case where the input signal is such that the impedance of the attenuator circuit 30 is expressed as $$Z_{30} = \frac{r_e}{2} \doteq R_3 \quad (4')$$

The audio signal $ei$ applied to the terminal 1 is attenuated to the effective input signal $ei'$ that is, from equations (8), (4'), (5) and (6), given as $$ei' = \frac{Zei}{Ra+Z} = \frac{ei}{Ra(\frac{1}{R_3} + \frac{1}{R'} + \frac{1}{Z_{30}}) + 1} \quad (7')$$

$$= \frac{ei}{Ra(\frac{1}{R_3} + \frac{1}{Z_{30}}) + 1} = \frac{ei}{Ra(\frac{2}{R_3}) + 1}$$

$$= \frac{R_3}{R_3 + 2Ra} ei$$

$(R' >> 1)$

With a further increase in the input signal, the output impedance $Z_{30}$ of the attenuator circuit 30 as viewed from the input terminal 1 is accordingly further reduced.

Assume a case where the input signal is such that the impedance $Z_{30}$ of the attenuator circuit 30 is $$Z_{30} = \frac{r_e}{2} \doteq Ra << R_3, R' \quad (4'')$$

From the equations (8), (4''), (5) and (6), the effective input signal $ei'$ is $$ei' = \frac{Z}{Ra+Z} ei = \frac{ei}{Ra(\frac{1}{R_3} + \frac{1}{R'} + \frac{1}{Z_{30}}) + 1} \quad (7'')$$

$$\doteq \frac{Z_{30}}{Ra+Z_{30}} ei = \frac{Ra}{Ra+Ra} ei = \frac{ei}{2}$$

$(Z_{30} << R_3, R')$

The amount of attenuation of the input signal $ei$ is thus increased.

When the input signal still further increases until the impedance $Z_{30}$ of the attenuator circuit 30 is expressed as $$Z_{30} = \frac{r_e}{2} \doteq \frac{Ra}{200} \qquad (4''')$$

the input signal $ei'$ is given as below from the equations (8), (4'''), (5) and (6).

$$ei' = \frac{Z}{Ra + Z} ei = \frac{ei}{Ra(\frac{1}{R_3} + \frac{1}{R'} + \frac{1}{Z_{30}}) + 1} \qquad (7''')$$

$$\doteq \frac{Z_{30}}{Ra + Z_{30}} ei \doteq \frac{ei}{200 + 1} \doteq \frac{ei}{200}$$

It will be seen that the amount of attenuation of the input signal $ei$ is increased even more.

When the input signal is increased to such a degree that the AC signal produced at the terminal 1 exceeds several mV, the transistors $Q_9$ and $Q_{10}$ of the signal attenuator circuit 31 of the attenuator circuit 30 enter a non-linear region and are distorted. This distortion may be somewhat corrected by increasing the value of the resistor $Ra$. Since an increased resistance value of the resistor $Ra$ is accompanied by an increased attenuation in the absence of signal as noted from equation (9), however, the allowable range of increase in the value of the resistor $Ra$ has a certain limitation.

In spite of this, in view of the present target of automatic gain control in terms of variation range or effective range thereof is approximately 30 dB, the resistor $Ra$ of 5 KΩ or more adequately serves practical purposes.

By the way, it will be seen that the resistors $R_{10}$ and $R_{11}$ in the circuit of FIG. 2 are basically not required. In actual circuits, however, it is impossible that all the transistors have the same characteristics and therefore the current $I_3$ is not equal to the current $I_4$. The DC current flows either out of or into the output terminal of the signal attenuator circuit 31, thus changing the reference voltage $V_{B1}$ of the differential amplifier circuit 20. The result is that the DC voltage at the output terminal of the circuit 20 undergoes a change, so that when the gain control works very effectively, the linearity of the differential amplifier circuit 20 is affected. Generally, the characteristics of a PNP transistor in integrated circuits are different from those of an NPN transistor in the same circuits. In other words, the base-emitter voltage $V_{BE}$ of a PNP transistor is a little higher than that of an NPN transistor due to the same collector current. Therefore, the currents $I_1$, $I_4$, $I_3$ $I_2$ have relations $I_1 > I_4$ and $I_3 > I_2$. If the current $I_1$ is equal to the current $I_2$, $I_3$ is larger than $I_4$, thereby causing the current $I_x (= I_3 - I_4)$ to flow out from the signal attenuator circuit 31 to the differential amplifier circuit 20. In order to prevent this phenomenon, the resistance value of the resistor $R_{10}$ is rendered larger than that of resistor $R_{11}$ thereby to hold a relation $I_1 > I_2$. Further, it is arranged to make the current $I_3$ equal to $I_4$ by adjusting the values of resistors $R_{10}$ and $R_{11}$.

Another embodiment of the control circuit for the signal attenuator circuit is shown in FIG. 2. Examples of the embodiment are shown in the circuit diagrams of FIGS. 4, 5 and 6, in which like component elements are denoted by like reference numerals as in FIG. 2.

Figure 4:
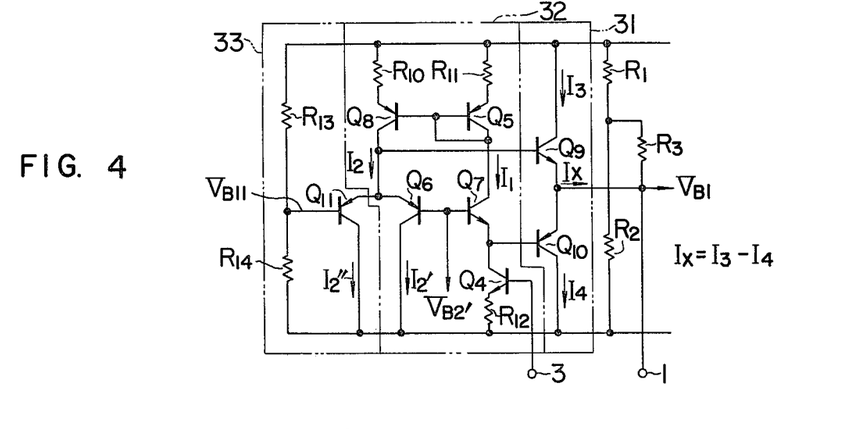
FIGS. 4, 5 and 6 are circuit diagrams showing other embodiments of the control circuit of the audio signal attenuator circuit of FIG. 2.

A current correcting circuit 33 including a pair of transistors $Q_6$ and $Q_{11}$ is added in the circuit of FIG. 4 for correcting the current in the gain control circuit, the transistors $Q_6$ and $Q_{11}$ being configured differentially. The base of the transistor $Q_{11}$ is connected to such a potential point that the base potential $V_{B11}$ of the transistor $Q_{11}$ in the absence of a control signal at the terminal 3 is equal to the base potential $V_{B2}'$ of the transistors $Q_6$ and $Q_7$. By so doing, in the case where in response to a control signal applied, the current $I_x$ increases thereby to increase the base potential $V_{B2}'$, the current $I_2$ is caused to flow to the transistor $Q_{11}$ so as to reduce the base-emitter voltage $V_{BE6}$ of the transistor $Q_6$, resulting in a reduced current $I_3$.

Figure 5:
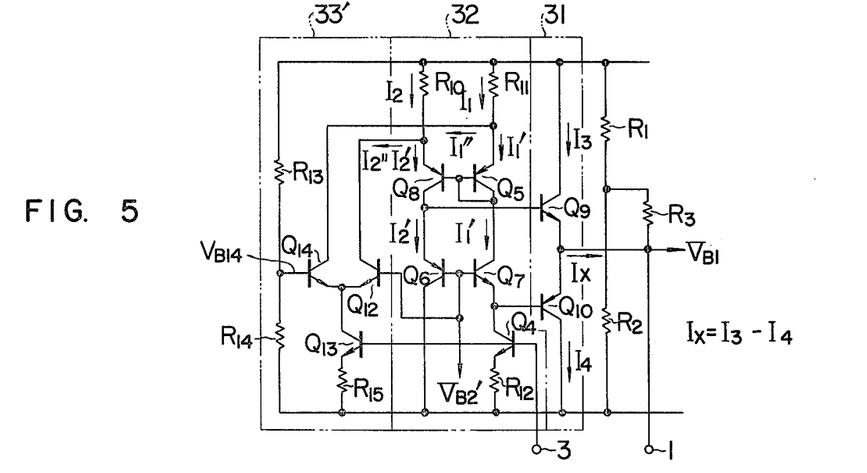

The circuit of FIG. 5 features a current-correcting circuit 33' including differentially-configured transistors $Q_{14}$, $Q_{12}$ and $Q_{13}$ for correcting the current in the gain control circuit. The resistance values of the resistors $R_{13}$ and $R_{14}$ are so set that the base potential $V_{B14}$ of the transistor $Q_{14}$ is equal to the base potential $V_{B2}'$ of the transistor $Q_6$ or $Q_7$. As a result, the current $I_x$ flows out ($I_3$ being larger than $I_4$) in the direction of arrow and, with the increase in the base potential $V_{B2}'$ of the transistors $Q_6$ and $Q_7$, the current $I_2''$ becomes larger than $I_1''$, while $I_2'$ becomes smaller than $I_1'$, thereby reducing the current $I_3$. The opposite is true when the current $I_x$ flows in the direction opposite to the arrow in the case of $I_3$ being smaller than $I_4$. In any of the above-mentioned cases, the circuit operates in such a way as to reduce the amount of current $I_x$, thereby minimizing the variation of the base potential $V_{B1}$ of the transistor $Q_1$.

Figure 6:
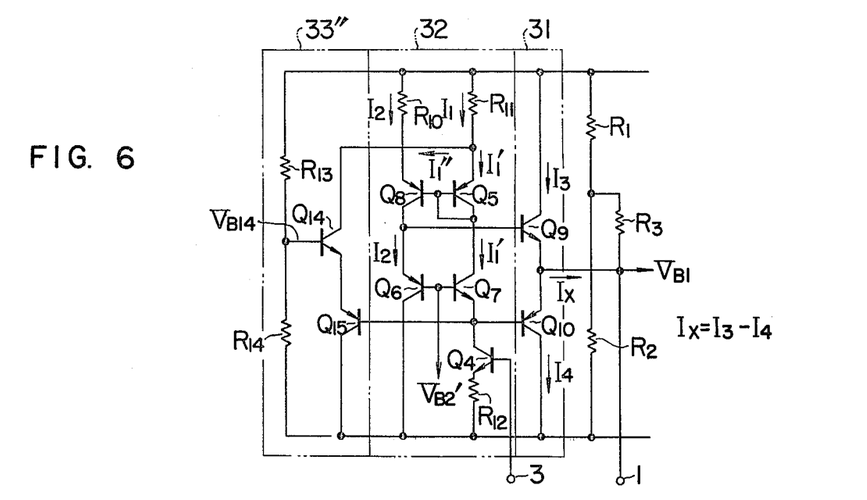

The circuit of FIG. 6 is newly provided with the current-correcting circuit 33'' including the transistors $Q_{14}$ and $Q_{15}$ for correcting the current in the gain control circuit. The resistance values of the resistors $R_{13}$ and $R_{14}$ are set in such a manner that the base potential $V_{B14}$ of the transistor $Q_{14}$ is equal to $V_{B1}$ plus the base-emitter voltage $V_{BE14}$ of the transistor $Q_{14}$. When the base potential $V_{B1}$ of the transistor $Q_1$ is reduced by the flow of current $I_x$ in the direction opposite to the arrow (i.e., when $I_3$ is smaller than $I_4$), the current $I_1''$ increases while the current $I_1'$ decreases. So, the current $I_3$ also decreases thereby to reduce the current $I_x$. The opposite is true when the current $I_x$ flows in the direction of arrow (when the current $I_3$ is larger than $I_4$). In both cases, the circuit operation is such as to reduce the current $I_x$.

Figure 8:
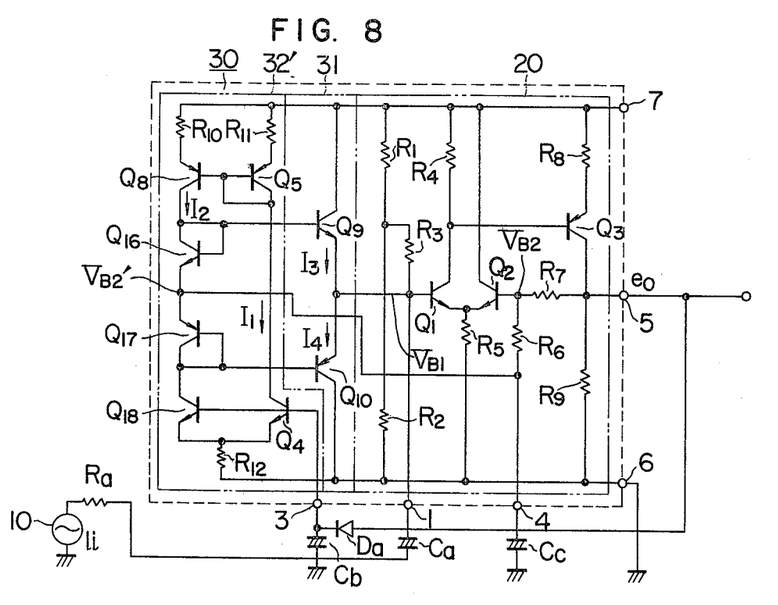

Still another embodiment of the invention is illustrated in FIG. 8. In this drawing, like component parts are denoted by like reference numerals as in FIGS. 2 to 6 and will not be described again. In this circuit configuration, the bases of the NPN transistors $Q_4$ and $Q_{18}$ of the control circuit 32' are connected to each other and also to the gain control voltage supply terminal 3. The emitters of the transistors $Q_4$ and $Q_{18}$ are also connected to each other and further to the earth terminal 6 through the resistor $R_{12}$. The collector of the transistor $Q_4$ is connected directly to the collector of the transistor $Q_5$, the base of which is connected to the base of the transistor $Q_8$. The base of transistor $Q_5$ is connected to the collector of transistor $Q_5$. The collector of the transistor $Q_{18}$ is connected to the base and collector of the PNP transistor $Q_{17}$, the emitter of which is connected to the emitter of the NPN transistor $Q_{16}$. The collector of the transistor $Q_{18}$ is also connected to the base of the PNP transistor $Q_{10}$, the emitter of which is connected to the emitter of transistor $Q_9$ of the signal attenuator circuit 31. The emitter common to the transistors $Q_{16}$ and $Q_{17}$ is connected to the base of the transistor $Q_2$ of the differential amplifier circuit 20 through the resistor $R_6$. The emitter common to the transistors $Q_{10}$ and $Q_9$ is connected directly to the signal input terminal 1 and the base of the transistor $Q_1$ of the differential amplifier circuit 20 respectively. The collector and base of the transistor $Q_{16}$ which are connected to each other are further connected to the collector of the transistor $Q_8$ and the base of the NPN transistor $Q_9$.

In this circuit configuration, assume that no DC voltage is applied to the terminal 3. All the transistors in the attenuator circuit 30 are in non-conducting state, and the DC and AC impedances as viewed from the input terminal 1 toward the circuit 30 are very high. As a result, the input signal $ei$ to the terminal 1 is introduced in its entirety to the differential amplifier circuit 20 through the resistor $Ra$ and the capacitor $Ca$.

By contrast, assume that a DC voltage exceeding the base-emitter voltage of the transistors $Q_{18}$ and $Q_4$ is applied to the terminal 3. The DC current $I_1$ flows through the resistor $R_{11}$ and transistors $Q_5$ and $Q_4$, while the DC current $I_2$ flows through the resistor $R_{10}$ and the transistors $Q_8$, $Q_{16}$, $Q_{17}$ and $Q_{18}$. Since the bases of the transistors $Q_8$ and $Q_5$ are commonly connected, the current $I_1$ equals current $I_2$ if resistor $R_{10}$ is equal to resistor $R_{11}$. Under this condition, suppose all the transistors have the same characteristics and that the emitter-grounded DC current amplification factor $h_{fe}$ thereof is set so high as to permit the base current to be ignored. The base potential $V_{B1}$ of the transistor $Q_1$, the base potential $V_{B2}$ of the transistor $Q_2$ and the emitter potential $V_{B2}'$ of the transistors $Q_{16}$ and $Q_{17}$ are equal to each other, so that the currents $I_2$, $I_3$ and $I_4$ are also equal to each other, thus preventing a DC current from flowing out of or flowing into the attenuator circuit. For this reason, in spite of the fact that the output terminal of the signal attenuator circuit 31 is connected directly to the input terminal of the amplifier circuit 20 as in the embodiment of FIG. 2, the DC bias of the amplifier circuit 20 is not affected by the signal attenuator circuit 31.

Figure 9A:
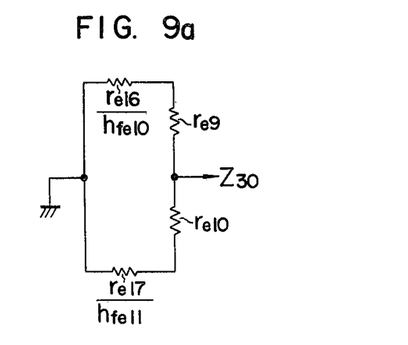
FIGS. 9a and 9b are equivalent circuit diagrams of the audio signal attenuator circuit and the control circuit in FIG. 8.
Figure 9B:
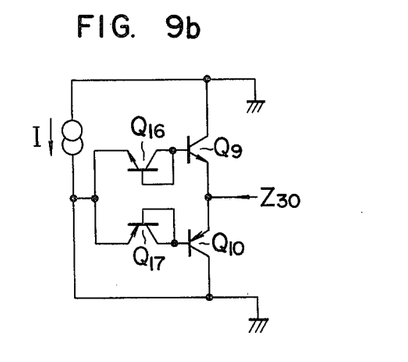

A circuit equivalent to the circuit of FIG. 8 is shown in FIG. 9, in which the output impedance of the attenuator circuit 30 as viewed from the input terminal 1, like the preceding embodiment, is expressed as $$Z_{30} = \frac{r_e}{2} \tag{4}$$

On the other hand, the effective input signal $ei'$ at the input terminal 1 is given by $$ei' = \frac{Z_{30}}{Ra + Z_{30}} ei = \frac{\frac{r_e}{2}}{Ra + \frac{r_e}{2}} ei = \frac{r_e}{2Ra} ei \tag{10}$$

As in the preceding embodiment, the input signal is attenuated as shown in equation (10) above.

It will be seen that, in the embodiment of FIG. 8 also, neither resistor $R_{10}$ nor $R_{11}$ is required in principle. Due to the fact that all the transistors are not the same in characteristics in an actual circuit, however, the current $I_3$ is not equal to $I_4$. This causes a current outflow from or inflow into the output terminal of the signal attenuator circuit 31, with the result that the reference voltage $V_{B1}$ of the differential amplifier circuit 20 is changed thereby to vary the DC voltage at the output terminal 5 of the amplifier circuit 20, thus affecting the linearity of the differential amplifier circuit 20 in the case where a gain control works very effectively.

Figure 10:
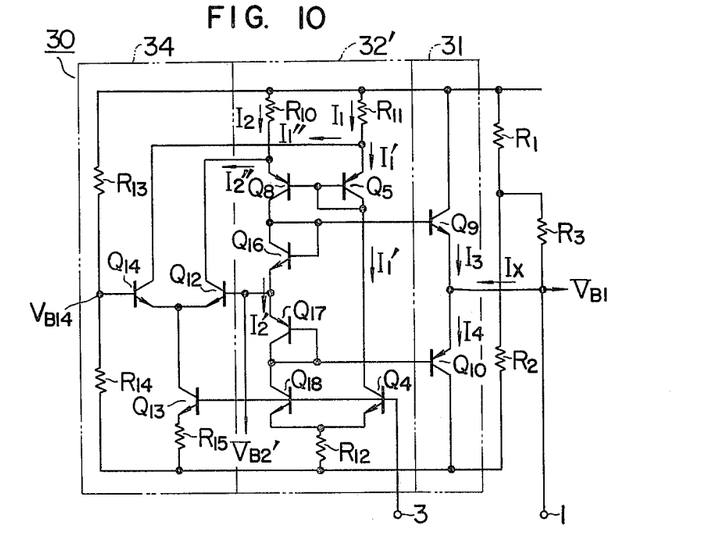
FIGS. 10 and 11 are circuit diagrams showing other embodiments of the control circuit of the audio signal attenuator circuit of FIG. 8.
Figure 11:
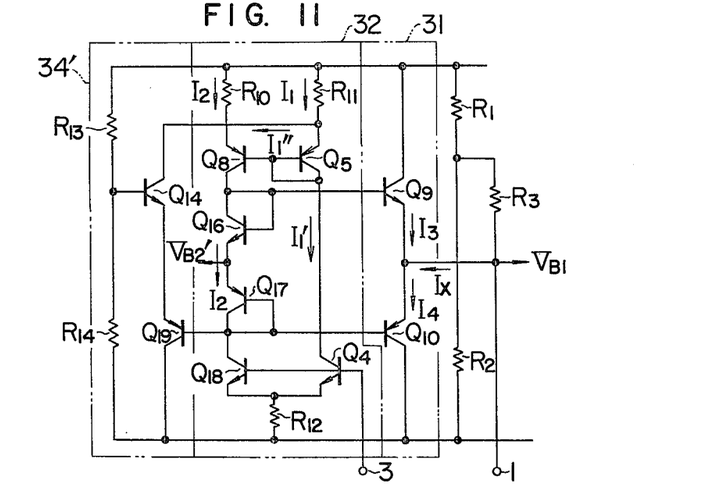

The circuits of FIGS. 10 and 11 feature a circuit 34 included in the current control circuit 32 for correcting the current flowing in the circuit 32. The DC voltage, for example, in the signal attenuator circuit 31 is prevented from flowing out to the side of the differential amplifier circuit 20 thereby to save the loss of the linearity of the amplifier circuit 20. In FIG. 10, the transistors $Q_{12}$, $Q_{13}$, $Q_{14}$ and resistors $R_{13}$, $R_{14}$ and $R_{15}$ make up the correcting circuit 34. The base of the transistor $Q_{14}$ is connected to a point of the same potential as the base potential $V_{B1}$ of the transistor $Q_1$ in the absence of a control signal at the terminal 3. In other words, the resistors $R_{13}$ and $R_{14}$ are set in advance in such a manner as to obtain the relation $V_{B14} = V_{B1}$.

Now, assume that current $I_3$ is smaller than $I_4$ and that the difference $I_x$ therebetween flows in the direction of the arrow. The reference voltage $V_{B1}$ of the differential amplifier 20 is reduced thereby to reduce the voltage $V_{B2}'$ also. The voltage $V_{B2}'$ becomes lower than $V_{B14}$, thereby increasing the current $I_1''$. Although the current $I_2$ also increases, the current $I_2'$ remains unchanged. Therefore, the increment of the current $I_2$ is equal to the increase in the base current of the transistor $Q_9$, with the result that the current $I_3$ increases while the current $I_x$ decreases. In the event that the current $I_x$ flows in the direction opposite to the arrow, by contrast, the current $I_3$ is larger than $I_4$, so that the voltage $V_{B1}$ tends to increase. In spite of this, the correcting circuit 34 works the way opposite to the preceding case. Thus, in both cases, the correcting circuit 34 functions to dampen the variation of the voltage $V_{B1}$. In FIG. 10, if a resistor of several K $\Omega$ is inserted between the bases of the transistors $Q_{16}$ and $Q_9$ to compensate for the difference between the current amplification factors $h_{fe}$ of the transistors $Q_9$ $Q_{10}$, it is possible to prevent the deterioration of third harmonic distortion at the time of gain control operation. In FIG. 11, a circuit portion including the transistors $Q_{12}$ and $Q_{14}$ and resistors $R_{13}$ and $R_{14}$ makes up the current-correcting circuit 34' for the attenuator circuit 30. The resistance values of the resistors $R_{13}$ and $R_{14}$ are set in such a way that the base potential $V_{B14}$ of the transistor $Q_{14}$ in the signal attenuator circuit 31 is equal to $V_{B1}$ plus the base-emitter voltage $V_{BE14}$ of the transistor $Q_{14}$. When the current $I_x$ flows in the direction of the arrow ($I_4 > I_3$), the voltage $V_{B1}$ drops. Since the voltage $V_{B19}$ also drops, the current $I_1''$ increases, thereby causing the increase in the base current of the transistor $Q_9$ and the increase in the emitter current $I_3$, resulting in the current $I_x$ being decreased, as already explained with reference to FIG. 10. In this way, the circuit functions to dampen the voltage $V_{B1}$.

In the case where the current $I_x$ flows in the direction opposite to the arrow ($I_4 < I_3$), by contrast, the voltage $V_{B1}$ and the voltage $V_{B19}$ increase. Current $I_1''$ and current $I_2'$ are reduced, whereas the current $I_2$ rmains unchanged. Accordingly, the base current of the transistor $Q_9$ is reduced, thereby causing the reduction of current $I_3$ and hence the current $I_x$, thus preventing the potential $V_{B1}$ from increasing.

In any case, the circuit works in such a way as to reduce the variation of the base potential $V_{B1}$ of the transistor $Q_1$.

Figure 7:
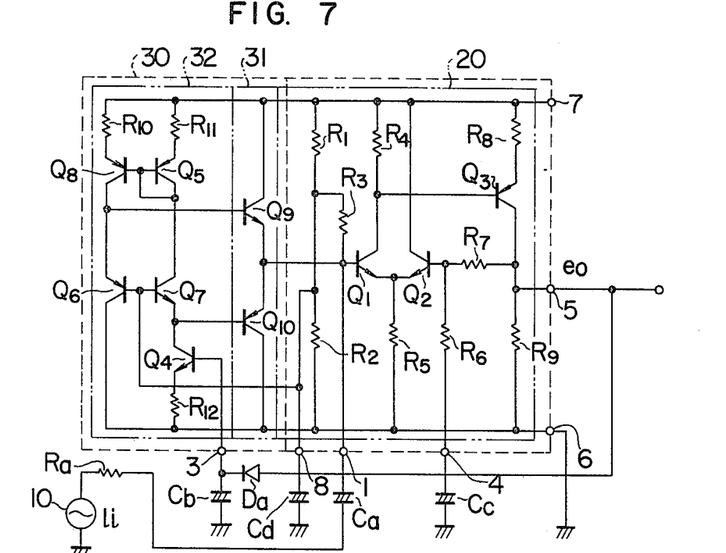
FIGS. 7, 8, 12 and 13 are circuit diagrams showing other embodiments of the gain control circuit according to the invention.
Figure 12:
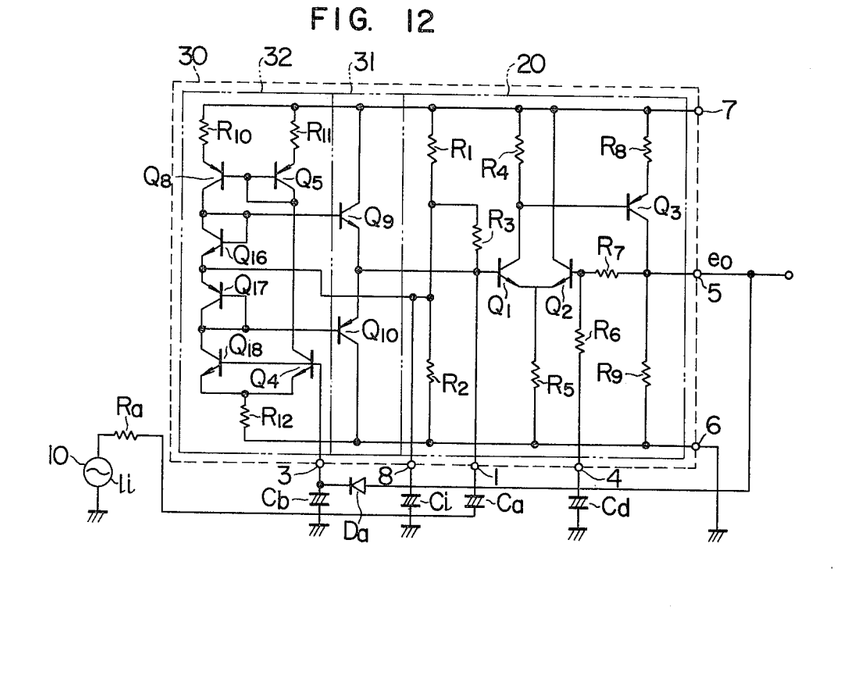
Figure 13:
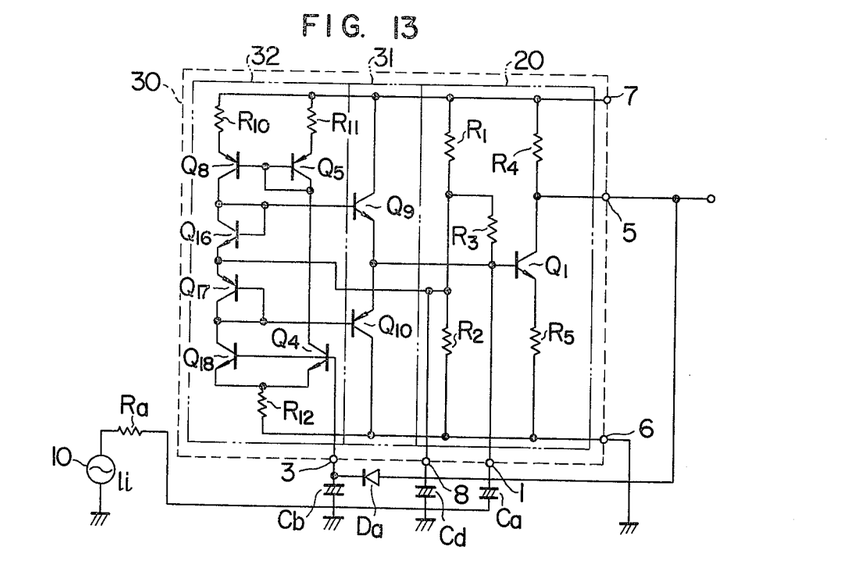

In the above-mentioned embodiment, the output terminal of the signal attenuator circuit 31 is connected to the non-reversing input terminal of the differential amplifier circuit 20, while the reference bias voltage terminal of the current control circuit 32 is DC-connected to the reversing input terminal of the differential amplifier circuit 20 for the purpose of circuit integration, thereby making it possible to reduce the number of external terminals. If no limitation is imposed on the number of external terminals, however, the reference bias voltage terminal may be connected to any point on condition that such a reference bias voltage terminal is at the same DC potential as the input terminal of the amplifier circuit in subsequent stage and that the AC impedance between the reference bias voltage terminal and ground is very low. Examples of such a circuit connection are shown in FIG. 7 and 12. The amplifier circuit is subsequent stage, which is shown as a differential type, need not necessarily be of differential type as contrast with the circuit diagram of FIG. 13. In FIG. 12, the deterioration of third harmonic distortion during the gain control operation may be prevented by inserting a resistor of several KΩ between the junction of the collector and base of the transistor $Q_{16}$ and the base of transistor $Q_9$.

According to the present invention, the output terminal of the input signal attenuator circuit may be connected directly to the input terminal of the input signal amplifier circuit, and therefore a single terminal may be used for them, thereby reducing the number of terminals.

Also, the decreased number of terminals made possible by the invention facilitates the application of monolithic integrated circuits thereto.

Further, according to the present invention, the DC current of the input signal attenuator circuit is prevented from flowing into the audio signal amplifier circuit, so that the DC bias of the amplifier circuit is not affected by the DC current.

We claim:

1. A gain control circuit comprising
(a) a sound amplifier circuit including an audio signal input terminal and an audio signal output terminal, said sound amplifier circuit amplifying and introducing to said sound output terminal the audio signal applied to said audio signal input terminal;
(b) gain control voltage means including an input terminal and an output terminal, said input terminal being connected to said audio signal output terminal, said means detecting part of the audio signal when said audio signal appears at said audio signal output terminal, said means producing a gain control voltage on the basis of said detected signal;
(c) an attenuator circuit connected between the output terminal of the gain control voltage-generating means and said audio signal input terminal of said sound amplifier circuit,
said attenuator circuit comprising a current control circuit controlled by the gain control voltage so as to be in a conducting state when said audio signal is applied to said audio signal input terminal and a gain control voltage above a predetermined voltage level is produced at the output terminal of said gain control voltage-generating means, and controlled so as to be in a nonconducting state when no audio signal exists on said audio signal input terminal, and further comprising a signal attenuator circuit controlled in accordance with the conducting state of said current control circuit, said signal attenuator circuit comprising a first transistor of a first conductivity type and a second transistor of a second conductivity type connected to each other in such a manner that the collector and emitter currents thereof flow in the same conducting direction; and said current control circuit comprising a third transistor controlled so as to be in a conducting state when the gain control voltage is above a predetermined voltage level and a current control semiconductor circuit controlled so as to be in a conducting state in accordance with the conducting state of said third transistor, and the current thereof being controlled by said third transistor, where said current control semiconductor circuit is provided with first and second current control semiconductor elements respectively having at least one junction electrode of a first type semiconductor and a second type semiconductor, the first type electrode of said first current control semiconductor element being connected to the base electrode of said first transistor, the second type electrode of said second current control semiconductor element being connected to the base electrode of said second transistor, and the remaining first and second type electrodes of said first and second current control semiconductor elements being connected commonly so that said first and second current control semiconductor elements control the current of said first and second transistors;
(d) circuit means for connecting the commonly connected electrodes of said first and second current control semiconductor elements in said current control circuit to a point of the same DC potentials as that of said audio signal input terminal of said sound amplifier circuit and for connecting the commonly connected electrodes to ground with a low impedance with respect to AC frquencies;
(e) means for connecting the common emitter of said first and second transistors in said signal attenuator circuit directly to said audio signal input terminal of said sound amplifier circuit.

2. A gain control circuit for a sound amplifier comprising:
a sound amplifier circuit including an input terminal to which an audio signal to be amplified is applied and an output terminal, said sound amplifier circuit amplifying the audio signal applied to the input terminal and introducing the thus amplified audio signal to said output terminal, and
further comprising detecting means, connected to the output terminal of said amplifier circuit, for detecting the signal appearing at the output terminal of the amplifier circuit and generating a gain control voltage depending on the detection intensity of the amplified audio signal, and gain control circuit also comprising an attenuator circuit comprising:
a signal attenuator circuit comprising a first transistor of first conductivity type and a second transistor of second conductivity type with emitters thereof connected together so that a current flows from a collector of the first transistor to that of the second transistor;
a current control circuit comprising first transistor means having a base to which the gain control voltage is applied for controlling said means so as to render it non-conductive or conductive in dependence upon whether the gain control voltage has exceeded a predetermined level, and a variable impedance device having a second transistor means comprising third and fourth transistors of different conductivity types, one of either the emitters or the bases of said third and fourth transistors being connected together and the remaining bases or emitters of said third and fourth transistors being connected to the bases of said first and second transistors respectively such that the PN emitter-base junctions of said third and fourth transistors are serially connected together in the same conducting direction and that the thus serially connected circuit of the PN emitter-base junctions is connected in parallel across the bases of said first and second transistors so as to allow current to flow in the thus connected parallel circuit in the same conducting direction, and said first transistor means being connected with said second transistor means so as to control the conduction of said second transistor means in response to its conductive state; and means for applying to the commonly connected emitters or bases of said third and fourth transistors a reference potential having the same potential as the DC potential at the input terminal of said sound amplifier circuit, and means for connecting the commonly connected emitters of said first and second transistors directly to the input terminal of said sound amplifier circuit, whereby the audio signal applied to the input terminal of sound amplifier circuit is attenuated in accordance with the magnitude of the output impedance of said attenuator circuit, which magnitude is controlled by the conduction of said current control circuit under condition of same current flow in the emitter-collector circuits of said first and second transistors, thereby to control the gain of said sound amplifier.

3. A gain control circuit according to claim 2, wherein said first and third transistors are of opposite conductivity types and said second and fourth transistors are of opposite conductivity types, the bases of said third and fourth transistors being commonly connected to each other, and the emitters of said third and fourth transistors being connected with the bases of the first and second transistors, respectively.

4. A gain control circuit according to claim 3, wherein said first transistor means comprises: a fifth transistor serially connected with emitter of said fourth transistor, with the gain control voltage being applied to the base of said fifth transistor; a first impedance element connected between said fifth transistor and ground; sixth and seventh transistors whose bases are commonly connected to each other as well as to the collector of the seventh transistor, and the collectors of said sixth and seventh transistors being connected with the emitter and collector of the third and fourth transistors, respectively; and second and third impedance elements connected with emitters of said sixth and seventh transistors respectively for supplying power to the sixth and seventh transistors therethrough.

5. A gain control circuit according to claim 2, which further comprises a current correcting circuit coupled with the current control circuit for equalizing the currents flowing through the respective third and fourth transistors.

6. A gain control circuit according to claim 2, wherein said first and third transistors are of the same conductivity type as well as said second and fourth transistors are of the same conductivity type, respectively, the emitters of said third and fourth transistors being commonly connected to each other, with the base and collector of the respective third and fourth transistors commonly connected and also connected with the bases of said first and second transistors, respectively.

7. A gain control circuit according to claim 6, wherein said first transistor means comprises: fifth and sixth transistors with the gain control voltage being applied to the bases thereof, said fifth transistor being serially connected between collector of said fourth transistor and ground; and seventh and eighth transistors whose bases are commonly connected to each other and connected in series with the sixth transistor, with the emitter-collector circuit of said eighth transistor being also connected in series with said sixth transistor, the emitter-collector circuit of said seventh transistor being connected in series with the collector of said third transistor.

8. A gain control circuit comprising:

a sound amplifier means, having input and output terminals, for amplifying an audio signal applied to its input terminal and providing said amplified signal at its output terminal;

a gain control means connected to said sound amplifier means for detecting the audio signal at the output terminal of said sound amplifier means and producing a gain control voltage in dependence upon the magnitude of said detected audio signal;

an attenuator means connected to the input terminal of said sound amplifier means for controlling the amplitude of the output of said sound amplifier means by shunting part of the audio input signal to ground, said attenuation means controlled by said gain control voltage;

said attenuation means comprising a first transistor of a first conductivity type and a second transistor of a second conductivity type; the emitters of said first and second transistors both being connected to the input terminal of said sound amplifier means; the collector of said first transistor connected to a DC power source and the collector of said second transistor connected to ground;

said attenuation means further comprising a third transistor of the first conductivity type, the emitter of which being grounded, the collector of which connected to the base of said second transistor and the base of which receives the gain control voltage;

said attenuator means further comprising a fourth transistor of the second conductivity type and a fifth transistor of the first conductivity type, the collector of which connected together and to the base of said fourth transistor, the emitter of said fourth transistor connected to the DC power source, the emitter of said fifth transistor connected to the base of said second transistor and the base of said fifth transistor connected to an AC ground;

said attenuator means further comprising sixth and seventh transistors of the second conductivity type, the collector of said sixth transistor connected to the base of said first transistor and the emitter of said seventh transistor, the emitter of said sixth transistor connected to the DC power source and the collector of said seventh transistor connected to ground.

9. A gain control circuit according to claim 8, wherein said sound amplifier circuit comprises:

a differential amplifier transistor circuit comprising in its first stage a bias circuit; said bias circuit comprising an additional first transistor with the base thereof connected to the audio signal input terminal, and an additional second transistor with the base thereof so grounded as to lower the AC impedance, said first and second additional transistors having the emitters thereof connected to each other;

said first additional transistor having the base thereof connected in DC fashion to the output terminal of said signal attenuator circuit, said second additional transistor having the base thereof connected in DC mode to the base of said fourth and fifth transistors of said current control circuit.

10. A gain control circuit according to claim 8, wherein said sound amplifier circuit comprises:

a differential amplifier transistor circuit comprising in its first stage a bias circuit; said bias circuit comprising an additional first transistor with the base thereof connected to the audio signal input terminal, and an additional said transistor with the base thereof so grounded as to lower the AC impedance, said first and second additional transistors having the emitters thereof connected to each other; and means for grounding the base of said first additional transistor through part of said bias circuit in such a manner as to lower the AC impedance;

said first additional transistor having the base thereof connected in DC mode to the output terminal of said signal attenuator circuit, said grounding means being connected in DC mode to the bases of said fourth and fifth transistors of said circuit control circuit.

11. A gain control circuit as in claim 8, wherein the attenuator means further comprises an eighth transistor of the second conductivity type with the emitter of which connected to the base of said first transistor, the collector of which grounded and the base of which connected to a fixed reference voltage.

12. A gain control circuit as in claim 8, wherein the attenuator means further comprises ninth, tenth and eleventh transistors of the first conductivity type, the base of said ninth transistor connected to the base of said fifth transistor, the collectors of said ninth and tenth transistors connected to the emitters of said sixth and fourth transistors, respectively, the base of said tenth transistor connected to a fixed DC voltage, the emitters of said ninth and tenth transistors both connected to the collector of the eleventh transistor, the emitter of which is grounded and the base of which receives said gain control voltage.

13. A gain control circuit as in claim 8, wherein the attenuator means further comprises a twelfth transistor of the first conductivity type and a thirteenth transistor of the second conductivity type, the emitters of which connected together, the collector of said twelfth transistor connected to the emitter of said fourth transistor, the base of said twelfth transistor connected to a fixed reference voltage, the base of said thirteenth transistor connected to the base of said second transistor and the collector of said thirteenth transistor grounded.

14. A gain control circuit comprising:

a sound amplifier means, having input and output terminals, for amplifying an audio signal applied to its input terminal and providing said amplified signal at its output terminal;

a gain control means connected to said sound amplifier means for detecting the audio signal at the output terminal of said sound amplifier means and producing a gain control voltage in dependence upon the magnitude of said detected audio signal;

an attenuator means connected to the input terminal of said sound amplifier means for controlling the amplitude of the output of said sound amplifier means by shunting part of the audio input signal to ground, said attenuation means controlled by said gain control voltage;

said attenuator means comprising a first transistor of a first conductivity type and a second transistor of a second conductivity type; the emitters of said first and second transistors both being connected to the input terminal of said sound amplifier means; the collector of said first transistor connected to a DC power source and the collector of said second transistor connected to ground;

said attenuator means further comprising a third transistor of the first conductivity type, the emitter of which being grounded, the collector of which connected to the base of said second transistor and the base of which receives the gain control voltage;

said attenuator means further comprising fourth and fifth transistors of the second conductivity type, the bases of which connected to the collectors of said third and fourth transistors, the emitters of which connected to a DC power source, the collector of said fifth transistor connected to the base of said first transistor;

said attenuator means further comprising sixth, seventh, and eighth transistors of the first, second and first conductivity type, respectively, the emitters of the sixth and seventh transistors connected together and connected to an AC ground, the collectors of the seventh and eighth transistors connected together and also connected to the bases of the second and seventh transistors, the collector and base of the sixth transistor connected to the base of the first transistor, the base of the eighth transistor receiving the gain control voltage and the emitter connected to ground.

15. A gain control circuit according to claim 14, wherein said sound amplifier circuit comprises:

a differential amplifier transistor circuit comprising in its first stage a bias circuit; said bias circuit comprising an additional first transistor with the base thereof connected to the audio signal input terminal, and an additional second transistor with the base thereof so grounded as to lower the AC impedance, said first and second additional transistors having the emitters thereof connected to each other;

said first additional transistor having the base thereof connected in DC mode to the output terminal of said signal attenuator circuit, said second additional transistor having the base thereof connected in DC mode to the emitters of said fourth and eighth transistors of said current control circuit.

16. A gain control circuit according to claim 14, wherein said sound amplifier circuit comprises:

a differential amplifier transistor circuit comprising in its first stage a bias circuit; said bias circuit comprising an additional first transistor with the base thereof connected to the audio signal input terminal, and an additional second transistor with the base thereof so grounded as to lower the AC impedance, said first and second additional transistors having the emitters thereof connected to each other; and means for grounding the base of said first additional transistor through part of said bias circuit in such a manner as to lower the AC impedance;

said first additional transistor having the base thereof connected in DC mode to the output terminal of said signal attenuator circuit, said grounding means being connected in DC mode to the emitters of said fourth and eighth transistors of said current control circuit.

17. A gain control circuit as in claim 14, wherein said attenuator means further comprises ninth, tenth and eleventh transistors, the emitters of the ninth and tenth transistors both connected to the collector of the eleventh transistor, the bases of the ninth and tenth transistor connected to the emitter of the sixth transistor and a fixed reference voltage, respectively, the collectors of the ninth and tenth transistors connected to the emitters of the fifth and fourth transistors, respectively, the base of the eleventh transistor receiving the gain control voltage and the emitter connected to ground.

18. A gain control circuit as in claim 14, wherein the attenuator means further comprises twelfth and thirteenth transistors of first and second conductivity types, respectively, the emitters of which are connected together, the collector of the twelfth transistor connected to the emitter of the fourth transistor, the collector of the thirteenth transistor connected to ground, and the bases of the twelfth and thirteenth transistors connected to a fixed reference voltage and the base of the second transistor, respectively.

* * * * *